United States Patent [19]

Maeda et al.

[11] Patent Number: 5,376,591
[45] Date of Patent: Dec. 27, 1994

[54] METHOD FOR MANUFACTURING SEMICONDUCTOR DEVICE

[75] Inventors: Kazuo Maeda; Noboru Tokumasu; Yuko Nishimoto, all of Tokyo, Japan

[73] Assignee: Semiconductor Process Laboratory Co., Ltd., Japan

[21] Appl. No.: 895,472

[22] Filed: Jun. 8, 1992

[51] Int. Cl.⁵ .................................... H01L 21/02
[52] U.S. Cl. .............................. 437/238; 437/240; 437/941; 437/946; 148/DIG. 118
[58] Field of Search ............... 437/238, 240, 941, 946, 437/247; 148/DIG. 118

[56] References Cited

U.S. PATENT DOCUMENTS

| | | | |
|---|---|---|---|
| 3,850,687 | 11/1974 | Kern | 437/240 |
| 4,361,461 | 11/1982 | Chang | 204/192.32 |
| 4,590,091 | 5/1986 | Rogers | 437/173 |
| 4,708,884 | 11/1987 | Chandross et al. | 427/39 |
| 4,845,054 | 7/1989 | Mitchener | 437/238 |
| 4,872,947 | 10/1989 | Wang et al. | 156/643 |
| 4,985,372 | 11/1991 | Narita | 437/200 |
| 5,013,691 | 5/1991 | Lory et al. | 148/DIG. 118 |
| 5,166,101 | 11/1992 | Lee et al. | 437/238 |

FOREIGN PATENT DOCUMENTS

| | | |
|---|---|---|
| 0421203 | 9/1990 | European Pat. Off. . |
| 0436185 | 12/1990 | European Pat. Off. . |
| 0022862 | 2/1980 | Japan ................... 437/238 |
| 0113335 | 9/1980 | Japan . |
| 0052877 | 12/1981 | Japan ................... 437/238 |
| 0046036 | 3/1985 | Japan ................... 437/240 |
| 0025543 | 1/1989 | Japan ................... 437/240 |
| 0219232 | 8/1990 | Japan ................... 437/238 |
| 2086871 | 5/1982 | United Kingdom ......... 437/238 |

OTHER PUBLICATIONS

Fujino et al "Surface Modification of Base Material for TEOS/O$_3$ . . . " J. of Electromechanical Soc. vol. 139, No. 6 (Jun. 1992).

Wolf, Silicon Processing for the VLSI Era vol. 1 Process Tech. pp. 182–189 & 504.

Electronics Letters, vol. 26, No. 11, May 24, 1990, Enage GB pp. 733–734, XP000108687, K. Aite et al. "Novel Low Temperature RF Plasma Annealing using NH$_3$–N$_2$ Gas Mixture".

RCA Review, vol. 37, No. 1, Mar. 1976, Princeton US pp. 55–77 W. Kern "Densification of Vapor-Deposited Phosphosilicate Glass Films". pp. 55, paragraph 1–p. 56, paragraph 2; FIG. 3.

J. Vac. Sci Technol B3(5) Sep./Oct. 1985 pp. 1352–1356.

*Primary Examiner*—Brian Hearn
*Assistant Examiner*—Trung Dang
*Attorney, Agent, or Firm*—Lorusso & Loud

[57] ABSTRACT

A, method for forming semiconductor device, includes forming an insulating film on a body by chemical vapor deposition, at low temperature raising the temperature of, the body, and exposing the body to plasma gas.

18 Claims, 11 Drawing Sheets

FIG. 1(a)
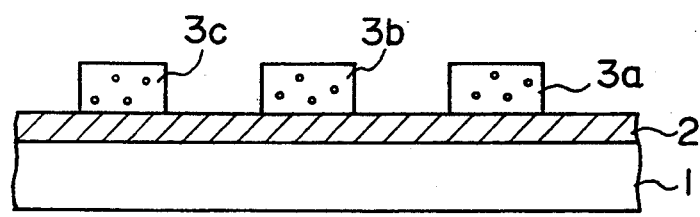
FIG. 1(b)
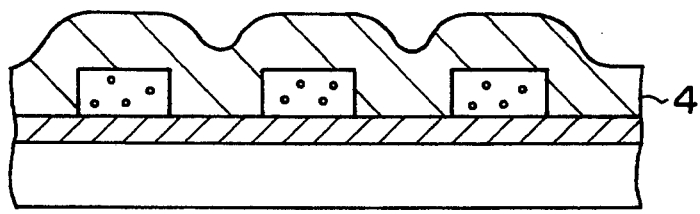
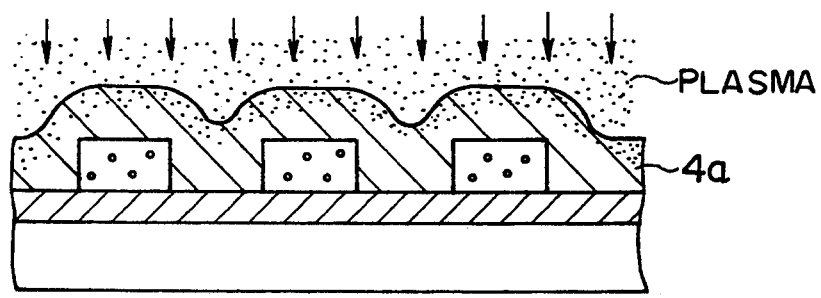
FIG. 1(c)
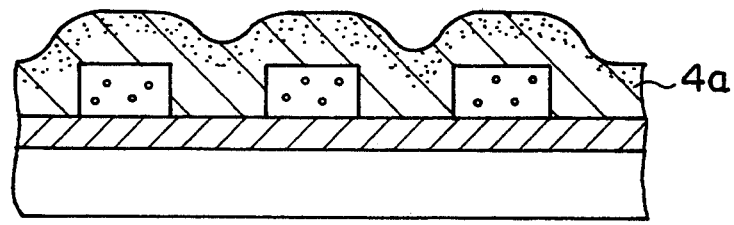
FIG. 1(d)

METHOD FOR MANUFACTURING SEMICONDUCTOR DEVICE

BACKGROUND OF THE INVENTION (1) Industrial Field of Utilization

The present invention relates to a method for manufacturing a semiconductor device, and more particularly to a method for manufacturing a semiconductor device including a method for reforming an insulating film formed by a low temperature CVD method.

(2) Prior Art

There are a variety of methods for forming an insulating film by a Chemical Vapor Deposition (CVD) method, but a thermal CVD method and a plasma CVD method are mainly used in recent years. Now, still higher refinement and higher densification are demanded in a very Large Scale Integrated Circuit (VLSI) and in a DRAM in particular. Thus, it is undesirable to form an insulating film by the plasma CVD method because step coverage is inferior and impurities such as carbon (C) are contained in the formed insulating film. As a result, a thermal CVD method capable of forming a film at a low temperature without thermal influence upon other components has attracted attention for forming a refined and highly densified DRAM, but further improvement of the film quality is desired.

There have been those methods that are conducted under the following conditions as a thermal CVD methods capable of forming a film at a low temperature.

① reaction gas is a mixed gas of mono-silane ($SiH_4$)/oxygen ($O_2$), and the temperature is from 350° C. to 450° C.

② reaction gas is a mixed gas of organic silane (TEOS)/ozone ($O_3$), and temperature is from 350° C. to 450° C.

Since the forming temperature is low in both cases, it is possible to restrain thermal distortion, thus exerting small influence upon the circumference. Therefore, such CVD method is adopted in many cases to form a passivation film and the like on an Al interconnection layer.

In case of a film not over 1 μm, however, the quality of an interlevel insulating film and the like exerts a big influence upon characteristics of a device, and the following problems have been newly encountered with an interlevel insulating film formed by the thermal CVD method. Namely, such problems that are related to reliability include:

① lowering of dielectric breakdown strength,
② increase of leakage current, and
③ corrosion of an Al film and the like which problems are caused sometimes because of such as reasons ① the density of the formed insulating film is low,
② moisture ($H_2O$) and bonds such as Si—OH are contained in the formed insulating film, and
③ bonds such as Si—H are present.

In order to solve such problems, it is required:

① to form a film at the highest possible temperature,
② to form a film while reducing growth rate to the minimum,
③ to increase $O_3$ concentration to the maximum in a method using TEOS, and
④ to anneal the film at a highest possible temperature after film formation. There are limits to such solutions. For example, it is not desirable to adjust the temperature to above 450° C. from a viewpoint of diffusion of Al into a Si substrate, generation of hillocks and the like in case of forming an interlevel insulating film for covering a lower Al interconnection layer. Further, the growth rate cannot be reduced too low without sacrificing mass productivity.

SUMMARY OF THE INVENTION

It is an object of the present invention which has been made in view of such conventional problems to provide a method for manufacturing a semiconductor device capable of improving film quality of an insulating film formed by a thermal CVD method at a low temperature. The means thereof will be described hereunder.

In the first place, the object is achieved by a method for manufacturing a semiconductor device in which, after an insulating film is formed by a CVD method, the temperature of the body is raised and this body is exposed to plasma gas.

In the second place, the object is achieved by a method for manufacturing a semiconductor device as set forth above wherein the temperature of the body falls within the range from 350° C. to 450° C. while it is exposed to the plasma gas.

In the third place, the object is achieved by a method for manufacturing a semiconductor device as set forth above, wherein the CVD method for forming the insulating film is performed under the condition that the reaction gas is a mixed gas of mono-silane ($SiH_4$)/oxygen ($O_2$) and the temperature is from 350° C. to 450° C.

In the fourth place, the object is achieved by a method for manufacturing a semiconductor device as set forth above, wherein CVD method for forming the insulating film is performed under the condition that the reaction gas is a mixed gas of organic silane (TEOS)/ozone ($O_3$) and the temperature is from 350° C. to 450° C.

In the fifth place, the object is achieved by a method for manufacturing a semiconductor device as set forth above, wherein the insulating film formed by the CVD method is an insulating film doped with impurities.

In the sixth place, the object is achieved by a method for manufacturing a semiconductor device as set forth above, wherein the insulating film doped with impurities is any one of a PSG film, a BSG film and a BPSG film.

In the seventh place, the object is achieved by a method for manufacturing a semiconductor device as set forth above, wherein the CVD method is performed under atmospheric pressure.

In the eighth place, the object is achieved by a method for manufacturing a semiconductor device as set forth above, wherein the CVD method is performed under low pressure.

In the ninth place, the object is achieved by a method for manufacturing a semiconductor device as set forth above, wherein the plasma gas is inert gas, oxygen gas or ammonia gas.

In the tenth place, the object is achieved by a method for manufacturing a semiconductor device as set forth above, wherein an insulating film is formed on the body to be formed by repeating the manufacturing method set forth above twice or more.

The operation of the present invention will be described based on experiments performed by the present inventor.

FIGS. 4(a), (b) and 5(a), (b) show the results involving experiments of plasma processing performed by the present inventor using oxygen plasma gas. Further, FIGS. 6(a), (b), 7,8(a), (b) and 9 show the results of experiments performed by the present inventor using ammonia plasma gas. Further, FIG. 10(a) shows a structure of a plasma processing system used in experiments performed by the present inventor.

Samples used in the experiments were produced as shown in FIGS. 3(a) and (b). Namely, a CVD SiO₂ film 11 having a film thickness of 6,000 to 8,000 Å is formed on a SiO₂ film 10 formed by thermal oxidation on a Si substrate (wafer) 9 (FIG. 3(a)) by a CVD system as shown in FIG. 11 under the following conditions
① the reaction gas is mixed gas of organic silane (TEO-S) /ozone (O₃) (O₃ concentration: 5 % in O₂),
② wafer temperature is at 400° C. and
③ the forming rate is at 800 to 1,000 Å/min.

Then, after the wafer 9 is placed on a wafer holding table 16 in a chamber 12 of a plane parallel plate type plasma processing system such as shown in FIG. 10(a), the wafer is heated with a heater and the wafer temperature is maintained at a constant temperature. In succession, after introducing processing gas into the chamber 12 through a gas inlet port 13, electric power having a frequency of 13.56 MHz is applied to this gas by means of an RF power supply 18 so as to activate the processing gas and to convert it into plasma, and thus maintaining it for a predetermined period of time.

Here the following conditions were adopted for applied electric power, plasma processing time and wafer temperature as shown hereunder. (1) When oxygen gas is used as the processing gas:
① plasma processing time: 5, 30, 60 minutes.
② wafer temperature: 350°, 375°, 400°, 450° C.
(2) When ammonia gas is used as the processing gas:
① applied electric power: 100, 200, 300 W.
② plasma processing time: 1, 2, 5 minutes.
③ wafer temperature: 200°, 300°, 400° C.

Besides, it has also been found that a CVD SiO₂ film 11a is not etched by such plasma processing.

Next, the following investigations were made on the CVD SiO₂ file 11a processed as described above. The type of investigation and the results of each investigation are described while differentiating between the case of oxygen gas and the case of ammonia gas.

(1) In the case of oxygen gas:
(a) Type of investigation
① Investigation of denseness of a film by the etching rate using an HF solution (FIGS. 4(a) and (b), and
② Investigation of film composition by means of infrared absorption spectrum (FIGS. 5(a) and (b)) were performed. Besides, similar investigations were also made for a CVD SiO₂ film applied with no plasma processing and a thermal oxide film formed by thermal oxidation for the purpose of comparison.

(b) Results of investigations
FIGS. 4(a) and (b) show the results of investigation on the denseness of a film by etching rate, in which FIG. 4(a) shows the result of investigating the change of the etching rate with respect to the etching thickness with plasma processing time as a parameter under the condition that the wafer temperature is maintained constant at 350° C., and FIG. 4(b) shows the result of investigating the change of the etching rate with respect to the etching thickness with the wafer temperature as a parameter under the condition that the plasma processing time is maintained constant at 5 minutes.

The results show that, as the plasma processing time gets longer or the wafer temperature gets higher, the etching rate is reduced, the influence thereof being exerted down deep below the surface, and the etching rate gets closer to the etching rate of the thermal oxide film gradually, and the CVD SiO₂ film becomes denser.

Further, FIGS. 5(a) and (b) show the results of determinations of film composition by infrared absorption spectrum, wherein FIG. 5(a) shows the existence of a bond such as Si—OH with respect to a sample processed with plasma processing time as a parameter under the condition that the wafer temperature is maintained constant at 350° C. and FIG. 5(b) shows the H₂O in the same sample, showing change of absorbance of the wave number (nm$^{-1}$) with the applied electric power as a parameter. The absorbance shown along the ordinates is assigned arbitrarily with respect to respective lines corresponding to respective parameters.

As a result, it is noticed that a peak showing H₂O and a bond such as Si—OH becomes smaller gradually as the plasma processing time gets longer.

According to above-described two different investigations, H₂O and bonds such as Si—OH begin to disappear and the CVD SiO₂ film 11a becomes denser as the plasma processing time gets longer or as the wafer temperature gets higher. That H₂O, Si—OH and the like are discharged from the CVD SiO₂ film 11 is believed to result from active radical particles in the plasma colliding with the surface of the CVD SiO₂ film 11 and the surface and interior of the CVD SiO₂ film 11 wherein ultraviolet light is generated by discharge.

Results similar to the above were obtained when inert gas such as nitrogen gas and argon gas were used.

(2) In the case of ammonia gas:
(a) Type of investigation
① Investigation of moisture content in a film by an electrochemical method (FIGS. 6(a), (b) and 7), and
② investigation of film composition by infrared absorption spectrum (FIGS. 8(a), (b) and 9) were performed. Besides a similar investigation was made on a CVD SiO₂ film applied with no plasma processing and a thermal oxide film formed by thermal oxidization for the purpose of comparison.

(b) Results of investigation
The results of investigation on the moisture content in a film by an electrochemical method will first be described.

FIG. 6(a) shows the change of the moisture content (wt %) in a film against an applied electric power under the conditions that the wafer temperature is at 400° C. and the plasma processing time is maintained constant at one minute, and also shows that the moisture content is reduced to about half as compared with a sample applied with no plasma processing.

Further, FIG. 8(b) shows the change of the moisture content (wt %) against the plasma processing time under the conditions that the wafer temperature is at 400° C. and the applied electric power is at 200 W, and also shows that the moisture content is reduced to about half as compared with a sample applied with no plasma processing.

Furthermore, FIG. 7 shows the change of the moisture content (wt %) in a film against the wafer temperature under the conditions that the applied electric power is at 200 W and the plasma processing time is maintained constant at one minute, and also shows that the moisture content is reduced to about half as compared with a sample applied with no plasma processing.

According to above-described results, it is considered that the CVD SiO₂ film 11a has become denser since the moisture content is reduced by performing plasma processing.

Next, the result of investigation of film composition by means of infrared absorption spectrum will be described. FIG. 8(a) shows the content of $H_2O$ with respect to the processed sample under the conditions that the plasma processing time is one minute and the wafer temperature is maintained constant at 400° C., and shows the change of absorbance with respect to the wave number ($nm^{-1}$) with the applied electric power as a parameter. Besides, the absorbance shown along the ordinates is assigned arbitrarily with respect to respective lines corresponding to respective parameters. According to the results, that which is applied with no plasma processing has a peak being off from a dotted line corresponding to the case including no moisture, but, in those that have been applied with plasma processing, the peak showing the existence of $H_2O$ disappears irrespective of the applied electric power.

Furthermore, FIG. 8(b) shows the content of $H_2O$ for a sample processed with the plasma processing time as a parameter under the conditions that the applied electric power is at 200 W and the wafer temperature is maintained constant at 400° C. As a result, with plasma processing, the peak showing the existence of $H_2O$ disappears irrespective of the plasma processing time.

Further, FIG. 9 shows the content of $H_2O$ for a sample processed with the wafer temperature as a parameter under the conditions that the applied electric power is at 200 W and the plasma processing time is maintained constant at one minute. As a result, the peak showing the existence of $H_2O$ becomes smaller gradually and disappears finally as the wafer temperature goes higher.

Besides, when the results shown in FIG. 9 for the case in which ammonia gas is used are comparable with the result for the use of oxygen gas shown in FIG. 5(b), the peak showing the existence of $H_2O$ becomes smaller gradually as the plasma processing time gets longer. Being different from that obtained with ammonia gas, however, the peak was only slightly noticeable in the case of the longest plasma processing time at 30 minutes in the range of the experiment. According to this result, it is recognized that plasma processing with ammonia has a greater effect than the plasma processing with oxygen.

According to the results of these two different investigation, $H_2O$ disappears by applying plasma processing, and the CVD $SiO_2$ film 11a becomes denser. This is considered to be caused by fact that $H_2O$ and the like are discharged from the CVD $SiO_2$ film 11 by active radical particles in the plasma colliding with the surface of the CVD $SiO_2$ film 11 or with the surface and the interior of the CVD $SiO_2$ film 11, which are irradiated with ultraviolet light generated by discharge.

As observed in the above-described experiments, according to plasma processing of the present invention, moisture ($H_2O$) and bonds such as Si—OH disappear so as to increase the density of the CVD $SiO_2$ film 11a formed at a low temperature. Thus, it is possible to remove a primary factor causing generation of moisture and the like from the interior of the CVD $SiO_2$ film 11a and also to prevent penetration of moisture and the like from the outside of the CVD $SiO_2$ film 11a.

With this, it is possible to prevent lowering of dielectric strength of the CVD $SiO_2$ film itself, increase of leakage current between upper Al interconnection formed on the CVD $SiO_2$ film later and lower Al interconnection, and lowering of reliability due to corrosion of Al interconnection and the like.

BRIEF DESCRIPTION OF THE DRAWINGS

FIGS. 1(a) to 1(d) show a series of sectional views explaining a first embodiment of a manufacturing method according to the present invention;

DETAILED DESCRIPTION OF THE INVENTION

Embodiments of the present invention will be described hereinafter with reference to the drawings.

① The first and the second embodiments of a manufacturing method of the present invention FIGS. 1(a) to (d) are sectional views explaining a method for forming an interlevel insulating film in the first and the second embodiments of the present invention. Further, FIG. 11 is a schematic diagram of a CVD system used for forming an interlevel insulating film, and FIGS. 10(a) and (b) are structural diagrams of a plasma processing system used for plasma processing of an interlevel insulating film formed by the CVD system shown in FIG. 11 according to an embodiment of the present invention.

First, such a CVD system and a plasma processing system will be described.

(A) CVD system used in an embodiment

Figure 11:
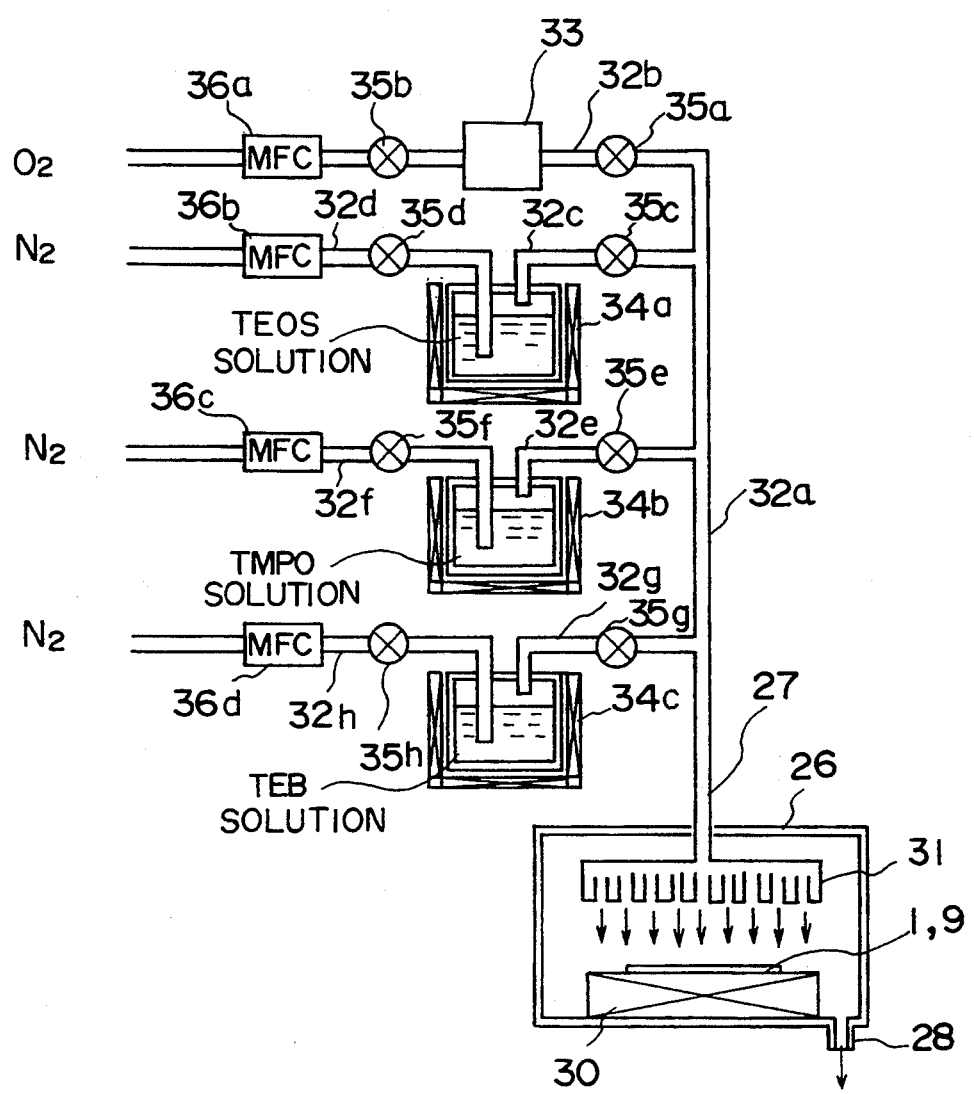
FIG. 11 is a schematic diagrams of a CVD film forming system related to an embodiment of the present invention.

FIG. 11 shows a CVD system for forming a $SiO_2$ film by a thermal CVD method a mixed gas of $TEOS/O_3$.

In FIG. 11, reference numeral 26 represents a chamber, 27 represents a reaction gas inlet port for introducing reaction gas into the chamber 26, 28 represents an outlet port for reducing pressure in the chamber 26 and/or exhausting processed gas and the like out of the chamber 26, 30 represents a wafer placement table on which a wafer 1 is placed and containing a heater for heating the wafer 1, and 31 represents a gas nozzle for directing the reaction gas onto the wafer 1.

Further, 32a represents a gas pipe for feeding the reaction gas to the chamber 26, and gas pipings 32b, 32c, 32e and 32g for feeding ozone ($O_3$) gas, nitrogen gas containing a TEOS solution are connected thereto. 32b represents a gas piping for feeding oxygen ($O_2$) gas or ozone gas generated by an ozonizer 33, 32c represents a gas piping for feeding nitrogen ($N_2$) gas containing a TEOS solution, 32e represents a gas piping for feeding nitrogen gas containing a TMPO or TMOP (Tri Methyl Phosphate: PO $(OCH_3)_3$: hereinafter referred to as TMOP) solution, and 32g represents a gas piping for feeding nitrogen gas containing TEB (Tri Ethyl Borote) solution. Further, on/off valves 35a to 35c, 35e and 35g are provided on respective gas pipings 32b, 32c, 32e and 32g. Furthermore, 32d, 32f and 32h represent gas pipings for feeding nitrogen gas to the TEOS solution, the TMOP solution and the TEB solution, respectively, and on/off valves 35d, 35f and 35h are provided on respective gas pipings 32d, 32f and 32h.

Further, 33 represents an ozonizer connected to the gas piping 32b, 34a to 34c represent heaters for heating and heat insulating the TEOS solution, and TMOP solution and the TEB solution, respectively, and 36a to 36d represent mass flow controllers for regulating flow rate of oxygen gas and nitrogen gas as carrier gas.

The TMOP solution is used for forming a PSG (phosphorous glass) film, the TEB solution is used for forming a BSG (boron glass) film, and furthermore, both of these solutions are used for forming a BPSG (boron-phosphorous glass) film.

(B) Plasma processing system used in an embodiment

Figure 10A:
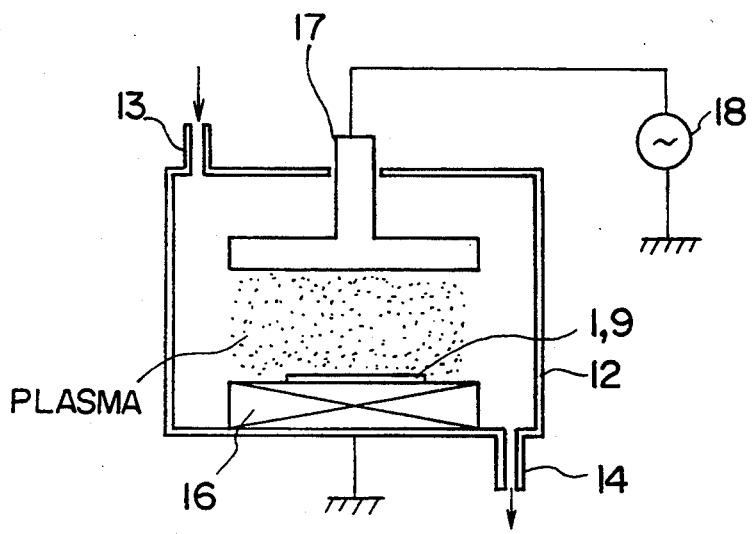
FIGS. 10(a) and 10(b) are schematic diagrams showing a plasma processing system related to an embodiment of the present invention.

Further, FIG. 10(a) shows a plane parallel plate type plasma processing system. A reference numeral 12 in the figure represents a chamber, 13 represents a gas inlet port for introducing processing gas into the chamber 12, 14 represents an exhaust port for reducing pressure in the chamber 12 and/or exhausting spent gas and the like, 16 represents a wafer placement table containing internally a heater for heating the wafer 1, and 17 represents one electrode for converting the gas into plasma. Alternating voltage is applied between this electrode 17 and the wafer placement table 16 connected to ground by means of an RF power supply 18 connected to the electrode 17 so that the processing gas introduced into the chamber 12 is converted into plasma.

Figure 10B:
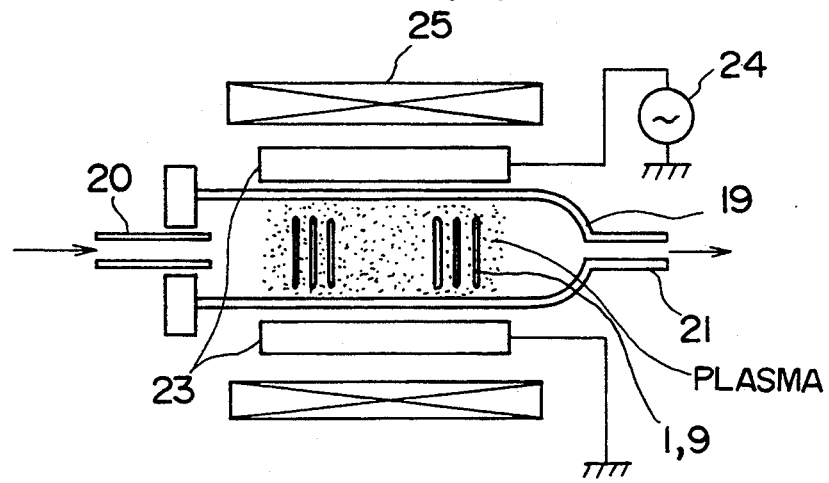

Furthermore, FIG. 10(b) shows another hot-wall type plasma processing system capable of batch processing. A reference numeral 19 in the figure represents a chamber composed of a quartz tube, 20 represents a gas inlet port for introducing processing gas into the chamber 19, 21 represents an exhaust port for reducing pressure in the chamber 19 and/or exhausting spent gas and the like, and 23 represents a pair of discharge electrodes for converting the processing gas into plasma. Alternating voltage is applied between one electrode and the other electrode connected to ground by means of an RF power supply 24 connected to one electrode so that the processing gas introduced into the chamber 19 is converted into plasma.

(C) Method for forming interlevel insulating film in the first embodiment of the present invention In the next place, the first embodiment of the present invention in which an interlevel insulating film is formed on a semiconductor substrate using the CVD system shown in FIG. 11 and the plasma processing system shown in FIG. 10(a) will be described with reference to FIGS. 1(a) to (d). Plasma processing using oxygen gas is performed therein.

First, as shown in FIG. 1(a), a $SiO_2$ film 2 is formed on a Si substrate (wafer: semiconductor substrate) 1 by the thermal oxidation, and Al interconnections 3a to 3d are formed on the $SiO_2$ film 2 thereafter.

Then, after placement the wafer 1 on the wafer placing table 30 in the chamber 26 of the CVD system shown in FIG. 11, the wafer 1 is heated by the heater and maintained at a temperature of approximately 400° C., and valves 35a and 35b are opened so as to conduct oxygen gas into the ozonizer 33, thereby to introduce the oxygen gas into a gas piping 32 so as to obtain an ozone gas concentration in oxygen gas of approximately 1% with regulating by mass flow controller 36a. Further, valves 35c and 35d are opened at the same time, and nitrogen gas at a predetermined flow rate, including the TEOS solution, is introduced to the gas piping 32, with regulating, by a mass flow controller 36b. Furthermore, the mixed gas of TEOS/$O_3$ introduced into the gas piping 32 as described above passes through the gas inlet port 27 of the chamber 26 and is introduced into the chamber 26. As a result, reaction occurs on the wafer 1, and a CVD $SiO_2$ film 4 starts to form. This state is maintained for a predetermined period of time, and Al interconnections 3a to 3c on the wafer 1 are covered by the CVD $SiO_2$ film 4 having a film thickness of approximately 8,000 Å (FIG. 1 (b)).

Next, the wafer 1 is taken out of the chamber 26 of the CVD system, and placed on the wafer placement table 16 in the chamber 12 of the plane parallel plate type plasma processing system shown in FIG. 10(a) for the purpose of reforming the CVD $SiO_2$ film 4. Thereafter, the wafer temperature is maintained at approximately 350° C. by the heater, and oxygen gas is introduced through a gas inlet port 13 while exhausting the inside of the chamber 12 through a gas exhaust port 14 and the inside of the chamber 12 is maintained at a predetermined pressure. Then, high frequency voltage with a frequency of 13.56 MHz is applied between the electrode 17 and the wafer placing table 16 by the RF power supply 18 so as to convert the oxygen gas into plasma. Then, the CVD $SiO_2$ film 4 is held for 60 minutes while keeping it exposed to oxygen plasma gas, thus completely reforming of the CVD $SiO_2$ film 4 (FIGS. 1 (c) and (d)).

According to above-described method for forming an interlevel insulating film in the first embodiment of the present invention, the CVD $SiO_2$ film 4 is formed at a low temperature. Thus, it is possible to prevent hillocks and the like of Al interconnections 3a to 3c from forming.

Figure 4A:
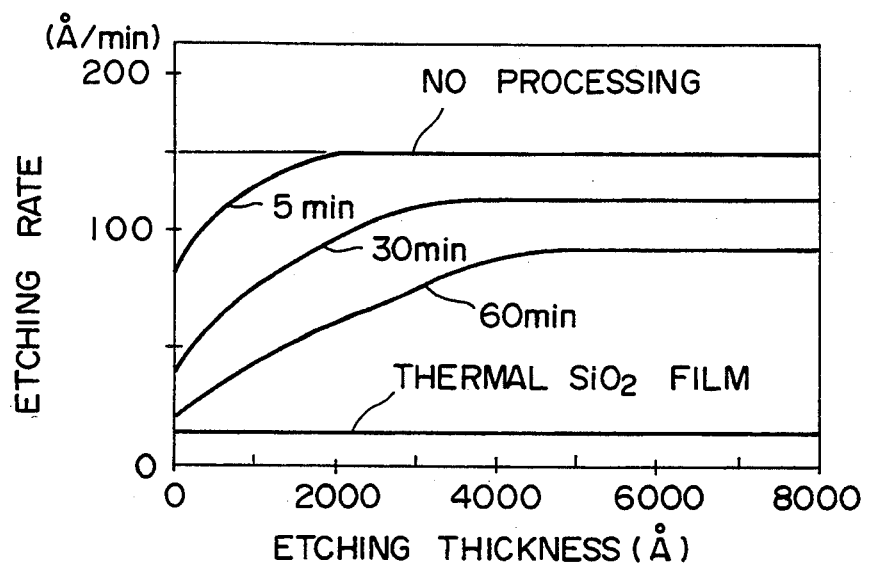
FIGS. 4a and 4b are graphs for the; results of investigation on the etching rate of a CVD $SiO_2$ film formed by a manufacturing method of the present invention.
Figure 4B:
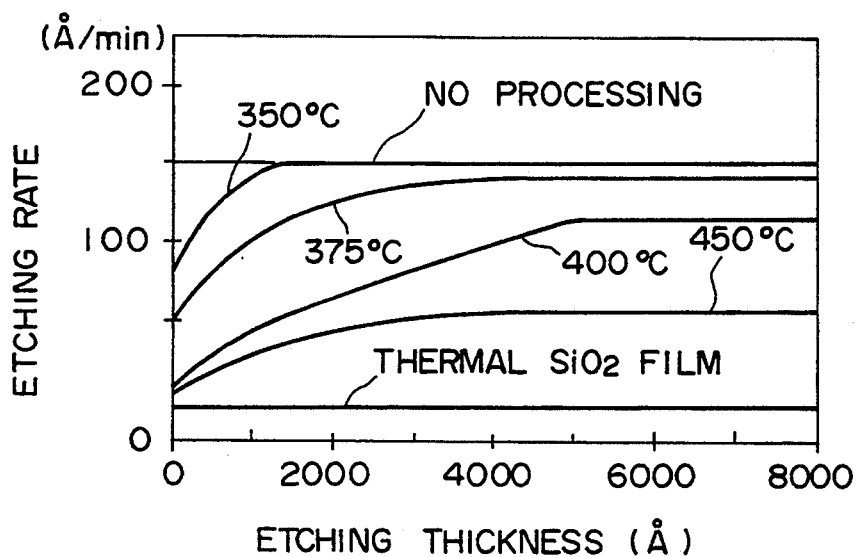
Figure 5A:
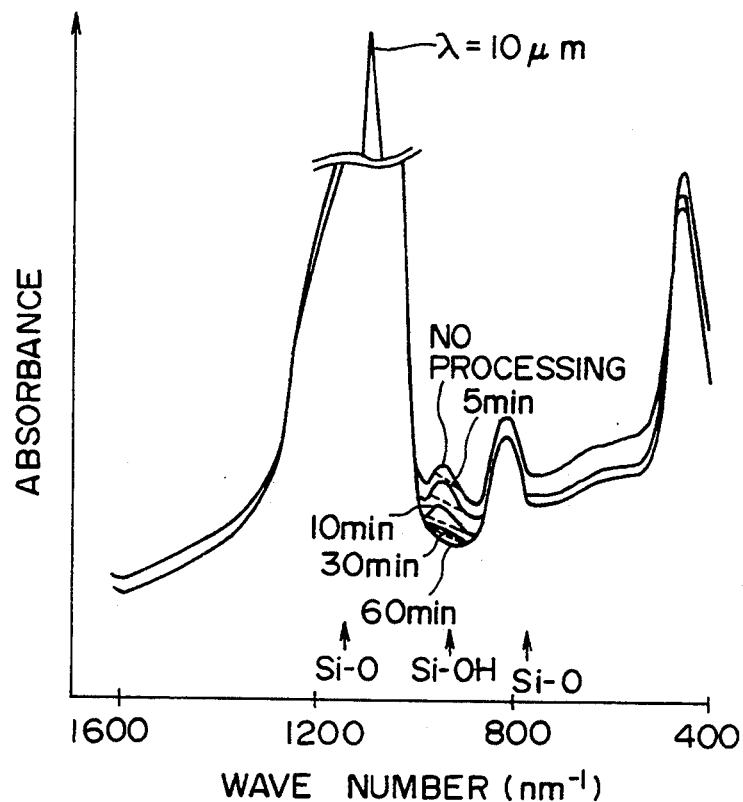
FIGS. 5(a) and 5(b) are graphs showing infrared absorption spectra of CVD $SiO_2$ films formed by the manufacturing method of the present invention.

Further, since plasma processing is performed, much moisture ($H_2O$) and bonds such as Si—OH and Si—H formed in the CVD $SiO_2$ film 4a at the time of formation due to formation at a low temperature as shown in FIGS. 5 (a) and (b), are removed and the CVD $SiO_2$ film 4a is densified as shown in FIGS. 4(a) and (b). Thus, it is possible to remove a primary factor causing moisture generation from the inside of the CVD $SiO_2$ film 4a and also to prevent migration of moisture from the outside of the CVD $SiO_2$ film 4a.

With this, it is possible to prevent lowering of dielectric strength of the CVD $SiO_2$ film 4 itself, to prevent increase of the leakage current between upper Al interconnection formed on the CVD $SiO_2$ film 4a later and lower Al interconnections 3a to 3c, and to prevent loss of reliability due to corrosion and the like of the Al interconnections 3a to 3c.

A a CVD SiO$_2$ film 4 formed from a mixed gas of TEOS-O$_3$ is used at the temperature of 400° C. in the first embodiment, but it may be formed within the range of 350° C. to 450° C. Further, a CVD SiO$_2$ film formed of silane (SiH$_4$)/oxygen (O$_2$) at temperature of from 350° C. to 450° C. may also be used.

Furthermore, oxygen gas is used as the gas to be converted into plasma, but it is also possible to use inert gas such as nitrogen gas and argon gas.

(D) Method for forming an interlevel insulating film in the second embodiment of the prevent invention Next, the second embodiment of the present invention for forming an interlevel insulating film on a semiconductor substrate using the CVD system shown in FIG. 11 and the plasma processing system shown in FIG. 10(a) will be described with reference to FIGS. 1(a) to (d). What differs from the first embodiment in the second embodiment is that plasma processing uses ammonia gas.

First, as shown in FIG. 1(a), after forming a SiO$_2$ film 2 on a Si substrate (wafer: semiconductor substrate) 1 similarly to the first embodiment, Al interconnections 3a to 3c are formed on the SiO$_2$ film 2.

In succession, as shown in FIG. 1(b), a CVD SiO$_2$ film (insultating film) 4 having a film thickness of approximately 8,000 Å is formed on the body using the CVD system shown in FIG. 11 similarly to the first embodiment.

Next, the wafer 1 is taken out of the chamber 26 of the CVD system, and placed on the wafer, placement table 16 in the chamber 12 of the plane parallel plate type plasma processing system shown in FIG. 10(a) for the purpose of reforming the CVD SiO$_2$ film 4.

Thereafter, the wafer 1 is heated by the heater contained inside the wafer placement table 16 so as to maintain the wafer temperature at approximately 400° C., the inside of the chamber 12 is exhausted through the exhaust port 14, and ammonia gas is introduced through the gas inlet port 13 when a predetermined pressure is reached so as to maintain the pressure inside the chamber 12 at approximately 1 Torr.

Then, high frequency electric power of approximately 200 W having a frequency of 13.56 MHz is applied between the electrode 17 and the wafer, placement table 16 by means of the RF power supply 18, thereby to convert ammonia gas into plasma. Then, when the CVD SiO$_2$ film 4 is hold for one minute in this state as it is exposed to ammonia gas, reforming of the CVD SiO$_2$ film 4 is completed (FIGS. 1(c) and (d)).

Figure 6A:
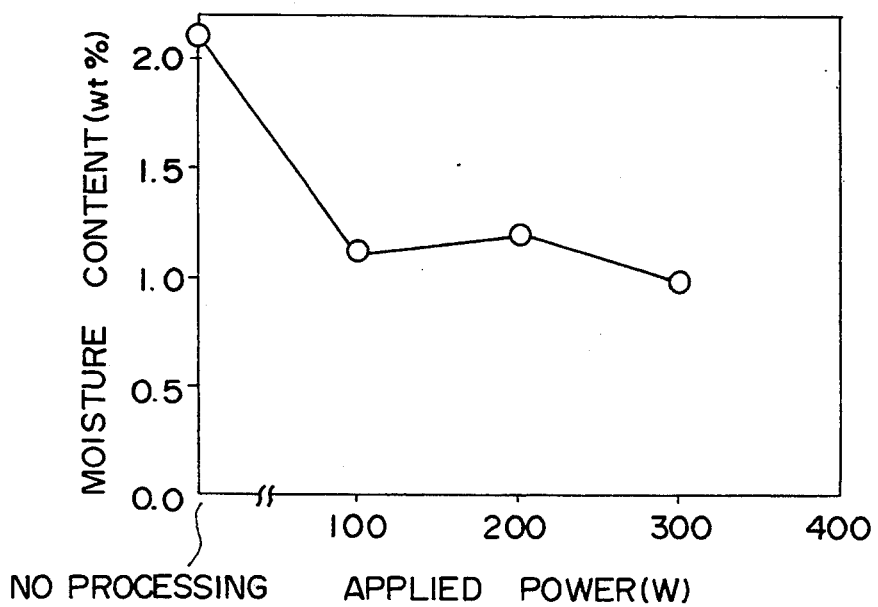
FIGS. 6(a) and 6(b) are graphs showing moisture content of a CVD $SiO_2$ film formed by the manufacturing method of the present invention.
Figure 6B:
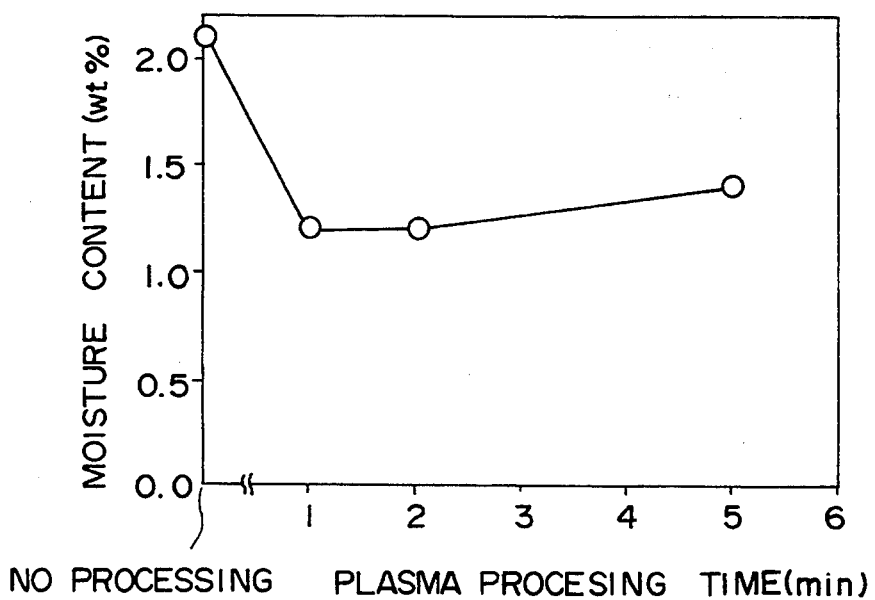
Figure 7:
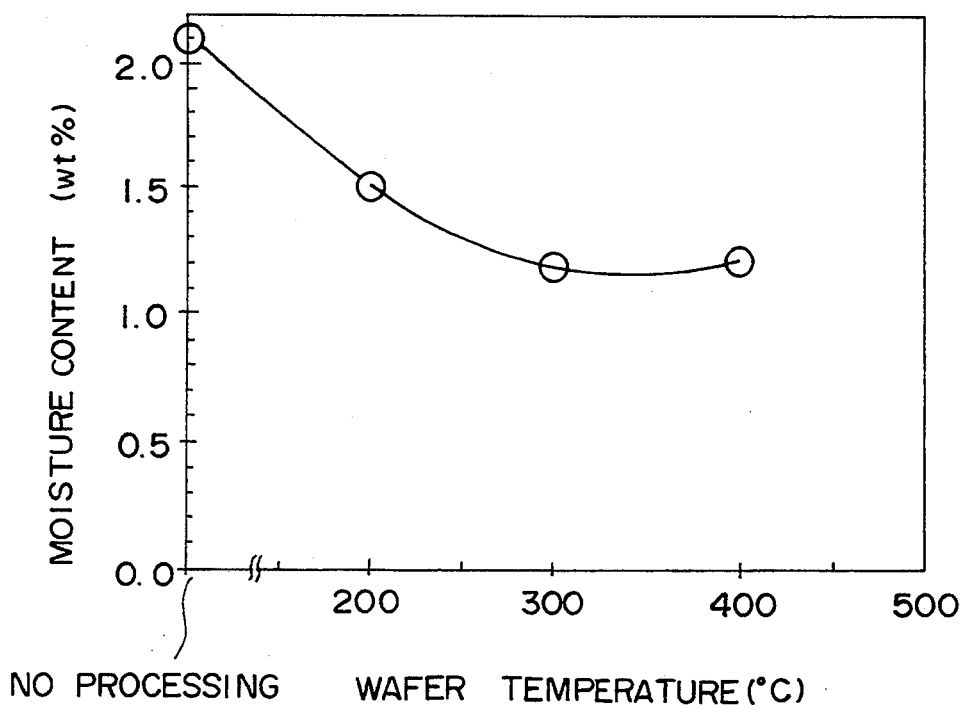
FIG. 7 is a graph showing moisture content of a CVD $SiO_2$ film formed by a manufacturing method of the present invention.
Figure 8A:
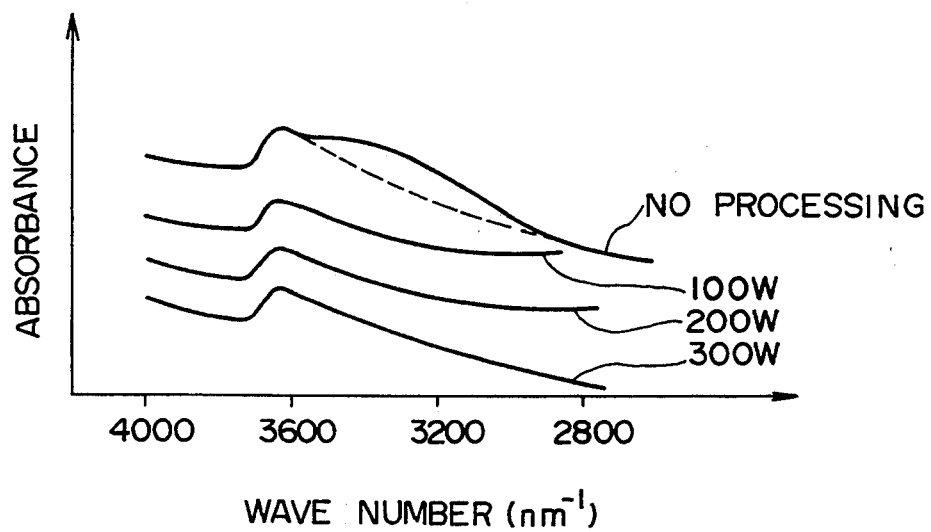
FIGS. 8(a) and 8(b) are graphs showing infrared absorption spectra of CVD $SiO_2$ films formed by a manufacturing method of the present invention.
Figure 8B:
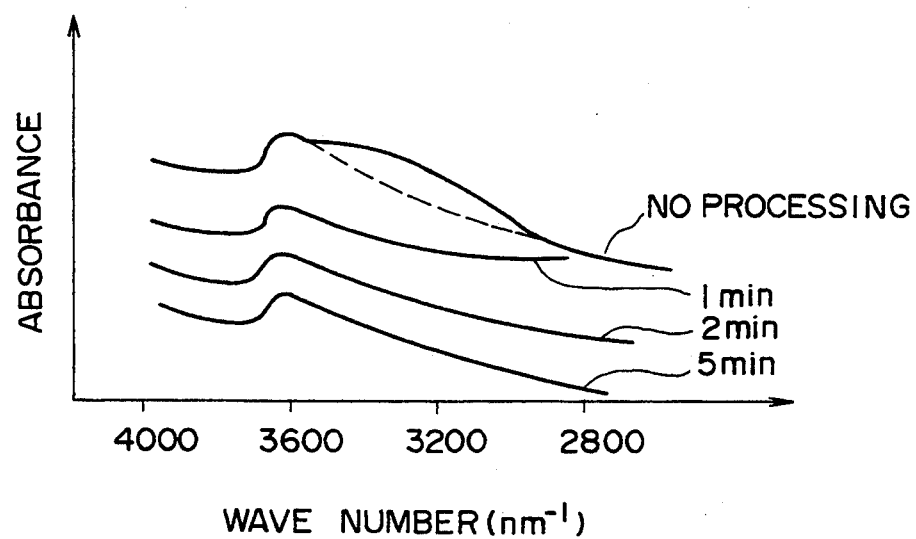

The CVD SiO$_2$ film 4 thus formed, was investigated for:

① moisture content film by an electrochemical method (see FIGS. 6(a), (b) and 9, and ② of film composition by infrared absorption spectrum (see FIGS. 8(a), (b) and 9.

The moisture content was found to be reduced approximately half as compared with a case in which no processing is performed as shown in FIGS. 6(a), (b) and 7, and peaks showing existence of moisture (H$_2$O) disappear as shown in FIGS. 8(a), (b) and 9. Accordingly, it is considered that the CVD SiO$_2$ film 11a has become denser. When the CVD SiO$_2$ film 4 was left in the atmosphere as is for one week, no change was shown in the moisture content of the CVD SiO$_2$ film 4. This fact shows that a primary factor causing generation of moisture has been removed from the inside of the CVD SiO$_2$ film 4a and migration of new moisture from the outside of the CVD SiO$_2$ film 4 is prevented, and that the CVD SiO$_2$ film 11a has been made denser. This is considered to have occurred because H$_2$O and the like are discharged from the CVD SiO$_2$ film 11 by active radical particles in the plasma colliding with the surface of the CVD SiO$_2$ film 11 and because the surface and the inside of the CVD SiO$_2$ film 11 are irradiated with ultraviolet light generated by discharge.

Figure 5B:
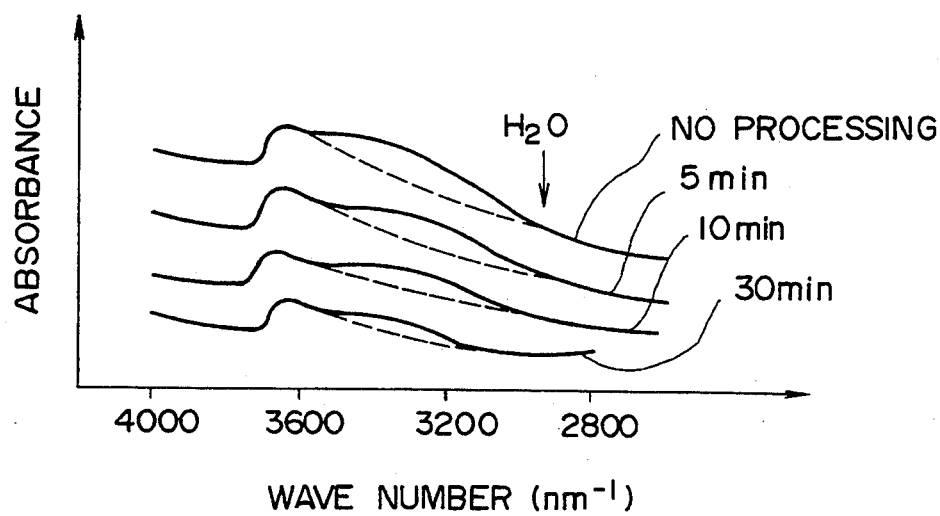
Figure 9:
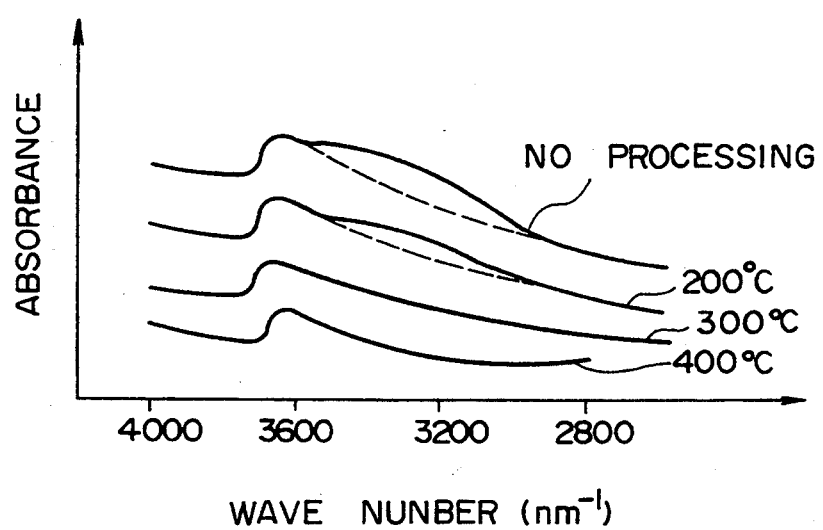
FIG. 9 is a graph showing infrared absorption spectra of CVD $SiO_2$ films formed by a manufacturing method of the present invention.

When the result shown in FIG. 9 for use of ammonia gas is compared with the result shown in FIG. 5(b) for use of oxygen gas, the peak showing the existence of H$_2$O becomes smaller gradually with the ammonia plasma processing time as compared with use of oxygen gas. However, being different from those that are processed with ammonia gas, the peak for water with the oxygen plasma is slightly noticed even at the longest plasma processing time, 30 minutes, in the range of experiment. According to this result, it is recognized that ammonia plasma processing has, a better effect than oxygen plasma processing.

As described above, according to the method for forming an interlevel insulating film in the second embodiment of the present invention, the CVD SiO$_2$ film 4 is formed at a low temperature. Hence, it is possible to prevent hillocks and the like of Al interconnections 3a to 3c from forming.

Further in plasma processing much moisture (H$_2$O) and bonds such as Si—OH and Si—H are removed from the CVD SiO$_2$ film 4a and the CVD SiO$_2$ film 4a is densified. Thus, it is possible to remove a primary factor causing generation of moisture from the inside of the CVD SiO$_2$ film 4a, and also to prevent moisture and the like from migrating from the outside of the CVD SiO$_2$ film 4a.

With this, it is possible to prevent lowering of dielectric strength of the CVD SiO$_2$ film 4a itself, to prevent increase of leakage current between upper Al interconnection formed on the CVD SiO$_2$ film 4a later and lower Al interconnections 3a to 3c and to prevent loss of reliability due to corrosion of Al interconnections 3a to 3c and the like.

In the second embodiment, the wafer temperature is set at 400° C. in plasma processing, but it may be set within the range of 200° C. to 400° C. Further, high frequency electric power for plasma conversion is set at 200 W, but power on the order of 100 to 300 W may be adopted.

② The third and the fourth embodiments of a manufacturing method of the present invention (A) The third embodiment FIGS. 2(a) to (d) are sectional views for explaining a method for forming an interlevel insulating film in the third embodiment of a manufacturing method of the present invention. Plasma processing using oxygen gas is performed.

What differs from the first embodiment is that a predetermined film thickness of 8,000 Å is finally formed by applying the manufacturing method of the present invention to thickness of 2,000 Å instead of forming the film with a predetermined film thickness of 8,000 Å.

Figure 2A:
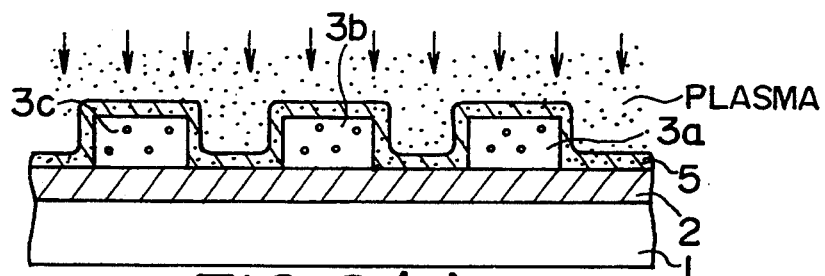
FIGS. 2(a) to 2(d) show a series of sectional views explaining a second embodiment of a manufacturing method according to the present invention.

First, as shown in FIG. 2(a), Al interconnections 3a to 3c are formed after forming a SiO$_2$ film 2 on a Si substrate (wafer: semiconductor substrate) 1 by thermal oxidation. Then, a first CVD SiO₂ film 5 having a film thickness of approximately 2,000 Å is formed similarly to the first embodiment from a mixed gas of TEOS/O₃ using the CVD system shown in FIG. 11. Then, the first CVD SiO₂ film 5 is exposed to oxygen gas converted into plasma for about 30 minutes at approximately 400° C. using the plasma processing system shown in FIG. 10(a). At this time, since the film thickness of the first CVD SiO₂ film 5 is sufficiently thin as shown in FIGS. 4(a), (b) and 5(a), (b) (hereinafter referred to as FIG. 4(a) and others), the film quality is improved extending over the entire film thickness.

Figure 2B:
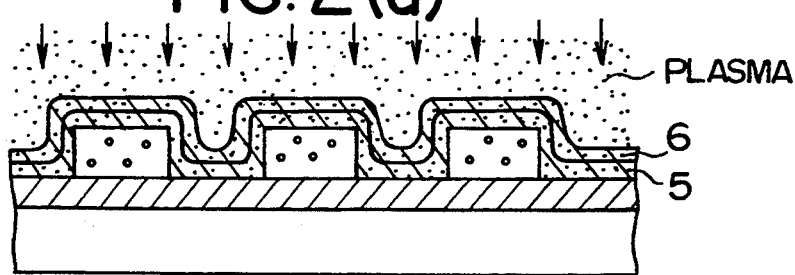

Next, a second CVD SiO₂ film 6 having film thickness of approximately 2,000 Å is formed similarly to the process shown in FIG. 2(a), and plasma processing is applied by oxygen gas converted into plasma (FIG. 2(b)). At this time, since the film thickness of the second CVD SiO₂ film 6 is also sufficiently thin, the film quality is improved extending over the entire film thickness as shown in FIG. 4(a) and others.

Figure 2C:
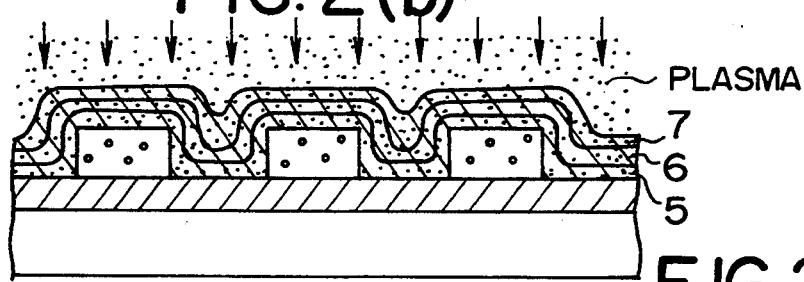

Then, a third CVD SiO₂ film 7 having a film thickness of approximately 2,000 Å is formed and applied with plasma processing similarly to the above (FIG. 2(c)).

Figure 2D:
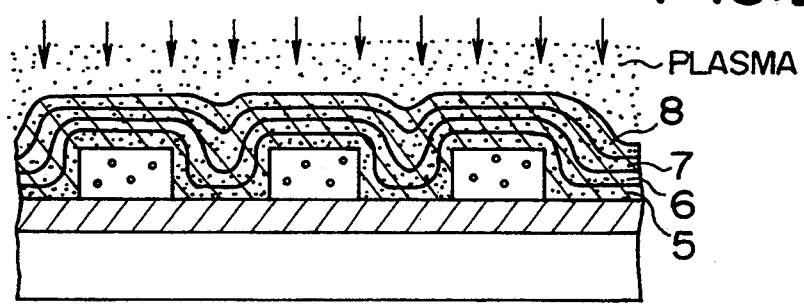
Figure 3A:
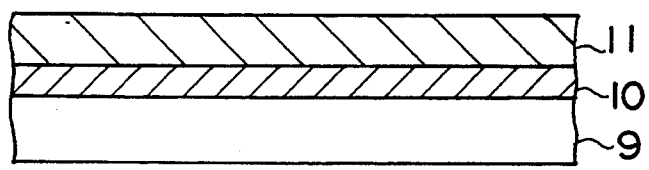
FIGS. 3(a) and 3(b) show sectional views illustrating an experiment in a manufacturing method according to the present invention.
Figure 3B:
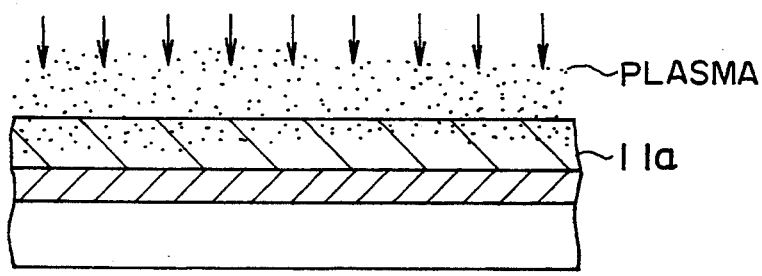

Then, a fourth CVD SiO₂ film 8 is formed and applied with plasma processing (FIG. 2(d)). At this time, since respective film thicknesses of the third and the fourth CVD SiO₂ films 7 and 8 are also sufficiently thin, the film quality is improved extending over the entire film thickness as shown in FIG. 4(a) and others.

As described above, according to the third embodiment, a predetermined film thickness of 8,000 Å is finally formed by applying the manufacturing method of the present invention to each successive sufficiently thin film having a thickness of 2,000 Å. Therefore, it is possible to further improve the film quality of the CVD SiO₂ films 5 to 8 as compared with the first embodiment.

(B) The fourth embodiment

FIGS. 2(a) to (d) are sectional views explaining a method for forming an interlevel insulating film in the fourth embodiment of a manufacturing method of the present invention. Plasma processing using ammonia gas is performed therein.

What differs from the second embodiment is that a predetermined film thickness of 8,000 Å is finally formed by applying the manufacturing method of the present invention to each of plural films, each having a thickness of 2,000 Å, instead of forming the predetermined film thickness of 8,000 Å at once.

First, as shown in FIG. 2(a), after forming a SiO₂ film 2 on a Si substrate (wafer: semiconductor substrate) 1 by thermal oxidation, Al interconnections 3a to 3c are formed similarly to the second embodiment.

Then, a first CVD SiO₂ film (insulating film) 5 having a film thickness of approximately 2,000 Å is formed similarly to the second embodiment from a mixed gas of TEOS/O₃ using the CVD system shown in FIG. 11.

Then, the first CVD SiO₂ film 5 is exposed to ammonia gas converted into plasma for about one minute with the wafer temperature at approximately 400° C. using the plasma processing system shown in FIG. 10(a). At this time, since the film thickness of the first CVD SiO₂ film 5 is sufficiently thin, the film quality is improved extending over the entire film thickness as shown in FIGS. 6(a), (b). 7, 8(c), (b) and 9 (hereinafter referred to as FIG. 6(a) and others).

Next, a second CVD SiO₂ film (insulating film) 6 having a film thickness of approximately 2,000 Å is formed similarly to the process shown in FIG. 2(a), and exposed to ammonia gas converted into plasma (FIG. 2(b)). At this time, as shown in FIG. 6(a) and others, the film quality is improved extending over the entire film thickness since the film thickness of the second CVD SiO₂ film 6 is also sufficiently thin.

Then, a third CVD SiO₂ film (insulating film) 7 having a film thickness of approximately 2,000 Å is formed and applied with plasma processing (FIG. 2(c)) similarly to the above. In succession, a fourth CVD SiO₂ film (insulating film) 8 is formed and applied with plasma processing (FIG. 2(d)). At this time, as shown in FIG. 6(a) and others, the film quality is improved extending over the entire film thickness since the film thicknesses of both the third and the fourth CVD SiO₂ films 7 and 8 are sufficiently thin.

As described above, according to the fourth embodiment of the present invention, a predetermined film thickness of 8,000 Å is finally formed by applying the manufacturing method of the present invention to plural successive sufficiently thin films of thickness of 2,000 Å. Hence, the film quality of the CVD SiO₂ films 5 to 8 can be further improved as a whole as compared with the first embodiment.

It will be appreciated that the instant embodiments are set forth by way of illustration and not limitation, and that various modifications and changes may be made without departing from the spirit and scope of the present invention.

What is claimed is:

1. A method for manufacturing a semiconductor device comprising the steps of:
    forming an insulating film on a substrate by chemical vapor deposition, said insulating film containing H₂O in its interior;
    heating said insulating film; and
    contacting said heated insulating film with a plasma consisting of at least one gas selected from the group consisting of inert gases and gaseous oxygen, to drive said H₂O out of said film, thereby densifying said film throughout its entire thickness.

2. A method in accordance with claim 1 wherein said contacting is conducted with said film at a temperature of 350° C. to 450° C.

3. A method in accordance with claim 1 wherein said insulating film further contains SiOH groups and wherein said contacting with a plasma eliminates said SiOH groups from said insulating film.

4. A method in accordance with claim 1 wherein said contacting induces ultraviolet radiation at the surface and interior of said film.

5. A method in accordance with claim 1 wherein said insulating film is SiO₂.

6. A method in accordance with claim 1 wherein said forming of an insulating film is by reaction of a silane and oxygen, in gaseous phase at 350° C. to 450° C., to deposit SiO₂ as said insulating film.

7. A method for manufacturing a semiconductor device according to claim 1, wherein the chemical vapor deposition for forming said insulating film is effected with a mixed gas of mono-silane (SiH₄)/oxygen (O₂) at 350° C. to 450° C.

8. A method for manufacturing a semiconductor device according to claim 1, wherein the chemical vapor deposition for forming said insulating film is effected with a mixed gas of organic silane (TEOS)/ozone ($O_3$) at 350° C. to 450° C.

9. A method for manufacturing a semiconductor device according to claim 1, wherein the insulating film formed by said chemical vapor deposition is an insulating film doped with impurities.

10. A method for manufacturing a semiconductor device according to claim 9, wherein said insulating film doped with impurities is any one of a PSG film, a BSG film and a BPSG film.

11. A method for manufacturing a semiconductor device according to claim 1, wherein the recited steps are repeated at least one more time.

12. A method for manufacturing a semiconductor device comprising the steps of:
    forming an insulating film on a substrate by chemical vapor deposition, said insulating film containing $H_2O$ in its interior;
    heating said insulating film; and
    contacting said heated insulating film with a plasma consisting of ammonia to drive said $H_2O$ out of said film, thereby densifying said film throughout its entire thickness.

13. A method in accordance with claim 12 wherein said contacting is conducted with said film at a temperature of 350° C. to 450° C.

14. A method in accordance with claim 12 wherein said insulating film further contains SiOH groups and wherein said contact with a plasma eliminates said SiOH groups from said insulating film.

15. A method in accordance with claim 12 wherein said contacting induces ultraviolet radiation at the surface and interior of said film.

16. A method in accordance with claim 12 wherein said insulating film is $SiO_2$.

17. A method in accordance with claim 12 wherein said forming of an insulating film is by reaction of a silane and oxygen, in gaseous phase at 350° C. to 450° C., to deposit $SiO_2$ as said insulating film.

18. A method in accordance with claim 1 wherein said plasma is formed of a gas consisting of oxygen.

* * * * *

UNITED STATES PATENT AND TRADEMARK OFFICE
CERTIFICATE OF CORRECTION

PATENT NO. : 5,376,591          Page 1 of 2
DATED      : December 27, 1994
INVENTOR(S) : MAEDA et al It is certified that error appears in the above-indentified patent and that said Letters Patent is hereby corrected as shown below:

IN THE ABSTRACT:
    Line 1, after "forming" insert —a—
    Line 4, delete "of," and insert —of—.

Column 5, line 37, "result" should read —results—
          line 48, "tigation" should read —tigations—
          line 50, after "by' insert —the—.

Column 6,
        line 61, "after "method" insert --using--;

line 68, after "containing" insert --internally--.

Col. 9, line 8, delete "of silanc" and insert --from a mixed gas silane" and after "at" insert --a--;

line 56, delete "film";

line 58, delete "of".

UNITED STATES PATENT AND TRADEMARK OFFICE
CERTIFICATE OF CORRECTION

PATENT NO. : 5,376,591
DATED : December 27, 1994
INVENTOR(S) : MAEDA et al

It is certified that error appears in the above-indentified patent and that said Letters Patent is hereby corrected as shown below:

Col. 10, line 56, delete "for";

line 64, after "to" insert --each of successive films formed of a--.

Signed and Sealed this

Tenth Day of October, 1995

Attest:

BRUCE LEHMAN

Attesting Officer      Commissioner of Patents and Trademarks